(12) United States Patent
Zhao

(10) Patent No.: US 10,763,320 B2
(45) Date of Patent: Sep. 1, 2020

(54) OLED DISPLAY PANEL AND PHOTOMASK

(71) Applicant: WUHAN CHINA STAR OPTOELECTRONICS SEMICONDUCTOR DISPLAY TECHNOLOGY CO., LTD., Wuhan, Hubei (CN)

(72) Inventor: Kaixiang Zhao, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 16/338,721

(22) PCT Filed: Mar. 26, 2019

(86) PCT No.: PCT/CN2019/079645
§ 371 (c)(1),
(2) Date: Apr. 2, 2019

(65) Prior Publication Data
US 2020/0185459 A1    Jun. 11, 2020

(51) Int. Cl.
*H01L 27/32*     (2006.01)
*H01L 51/52*     (2006.01)

(52) U.S. Cl.
CPC ........ *H01L 27/326* (2013.01); *H01L 27/3248* (2013.01); *H01L 51/5209* (2013.01)

(58) Field of Classification Search
CPC ......................... H01L 27/326; H01L 51/5209; H01L 27/3248
See application file for complete search history.

(56) References Cited

U.S. PATENT DOCUMENTS 9,013,098 B1 * 4/2015 Kim .................... H01L 27/3218 313/504
2016/0322433 A1 * 11/2016 Kim .................... H01L 27/3216

* cited by examiner

*Primary Examiner* — Anthony Ho
(74) *Attorney, Agent, or Firm* — Mark M. Friedman

(57) ABSTRACT

An OLED display panel and a photomask are provided. The OLED display panel includes a plurality of pixel areas arranged in a matrix on a plane. Each of the pixel areas is defined by an electrode and an organic light emitting material. The pixel areas increase in size along a first direction and the pixel areas increase in size along a second direction perpendicular to the first direction. The application solves the problem of non-uniformity in displaying images, caused by a feed-through effect in existing arts.

10 Claims, 2 Drawing Sheets

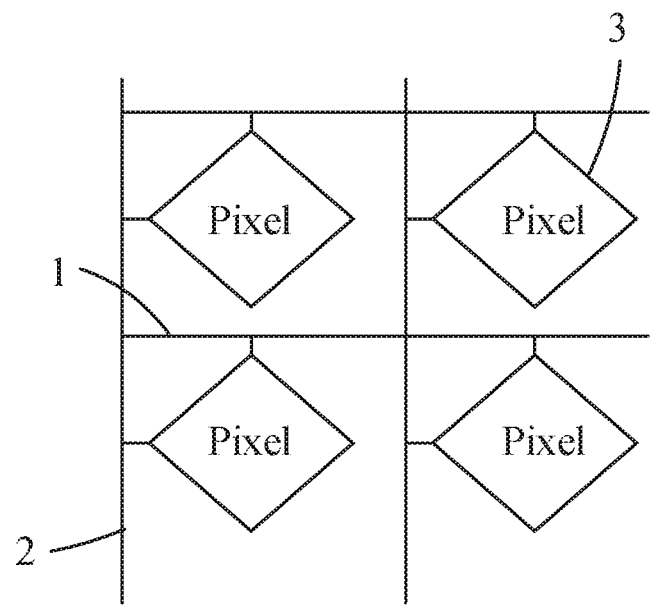
FIG. 1 (PRIR ART)
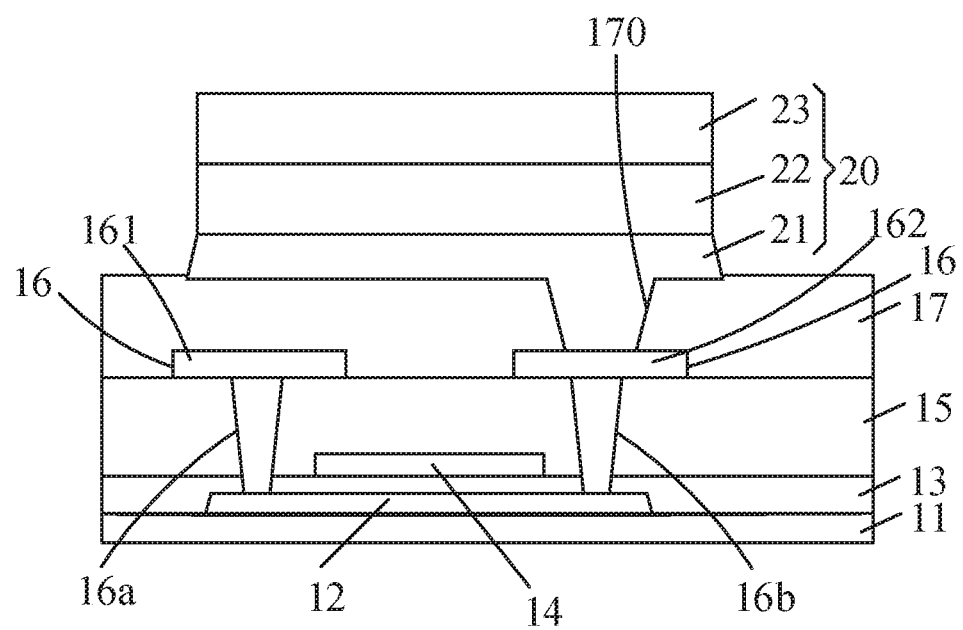
FIG. 2 (PRIR ART)

OLED DISPLAY PANEL AND PHOTOMASK

FIELD OF DISCLOSURE

The present application relates to display technologies, and more particularly, to an organic light emitting diode (OLED) display panel and a photomask.

DESCRIPTION OF RELATED ART

In an OLED display panel, every one of pixel structures includes an organic electroluminescence (EL) device including an anode, a cathode, and a light emitting layer disposed between the anode and the cathode. The light emitting layer is driven by an electric field between the anode and the cathode and emits light rays by injection and recombination of charge carriers.

FIG. 1 is a schematic diagram showing an existing OLED display panel. As shown in FIG. 1, the OLED display panel includes a plurality of scan lines 1, a plurality of data lines 2, and a plurality of pixel areas 3 interlaced by the scan lines 1 and the data lines 2. In the existing art, the pixel areas 3 have a same size. The scan lines 1 and the data lines 2 are metal lines. The resistance of a metal line increases as a propagated distance increases. Its voltage decreases as well. This will cause a feed-through effect. In a situation that the pixel areas 3 have the same size, the feed-through effect will affect current intensity generated by the EL device in light emission and cause non-uniformity in displaying images.

Technical Problems

An objective of the present application is to provide an organic light emitting diode (OLED) display panel and a photomask, for solving the problem of non-uniformity in displaying images, caused by a feed-through effect in existing arts.

Technical Solutions

To achieve above objective, an aspect of the present application provides an OLED display panel, including:
a plurality of pixel areas arranged in a matrix on a plane, each of the pixel areas defined by an electrode and an organic light emitting material, wherein the pixel areas increase in size along a scan driving direction and the pixel areas increase in size along a data driving direction, and wherein the pixel areas corresponding to a scan driving output end are larger than the pixel areas corresponding to a scan driving input end and the pixel areas corresponding to a data driving output end are larger than the pixel areas corresponding to a data driving input end.

In an embodiment of the present application, the electrode involves at least one of an anode and a cathode and the organic light emitting material is disposed between the anode and the cathode.

In an embodiment of the present application, the OLED display panel further includes a thin-film transistor (TFT) array substrate, on which the electrode and the organic light emitting material are disposed, the TFT array substrate including:
a substrate;
a polycrystalline silicon layer, disposed on the substrate;
a first insulating layer, disposed on the polycrystalline silicon layer and the substrate;
a gate electrode layer, disposed on the first insulating layer;
a second insulating layer, disposed on the gate electrode layer and the first insulating layer;
a source drain metal layer, disposed on the second insulating layer; and
a third insulating layer, disposed on the source drain metal layer and the second insulating layer,
wherein a source electrode via and a drain electrode via are disposed in the first insulating layer and the second insulating layer, a source electrode of the source drain metal layer is electrically connected to the polycrystalline silicon layer through the source electrode via, and a drain electrode of the source drain metal layer is electrically connected to the polycrystalline silicon layer through the drain electrode via;
wherein the electrode involves an anode and a cathode, and the anode, the organic light emitting material, and the cathode are sequentially disposed on the third insulating layer;
and
wherein an anode via is disposed in the third insulating layer, and the anode is electrically connected to the source drain metal layer through the anode via.

Another aspect of the present application provides an OLED display panel, including:
a plurality of pixel areas arranged in a matrix on a plane, each of the pixel areas defined by an electrode and an organic light emitting material, wherein the pixel areas increase in size along a first direction and the pixel areas increase in size along a second direction perpendicular to the first direction.

In an embodiment of the present application, the electrode involves at least one of an anode and a cathode and the organic light emitting material is disposed between the anode and the cathode.

In an embodiment of the present application, the first direction is a scan driving direction and the second direction is a data driving direction.

In an embodiment of the present application, the pixel areas corresponding to a scan driving output end are larger than the pixel areas corresponding to a scan driving input end and the pixel areas corresponding to a data driving output end are larger than the pixel areas corresponding to a data driving input end.

In an embodiment of the present application, the OLED display panel further includes a thin-film transistor (TFT) array substrate, on which the electrode and the organic light emitting material are disposed, the TFT array substrate including:
a substrate;
a polycrystalline silicon layer, disposed on the substrate;
a first insulating layer, disposed on the polycrystalline silicon layer and the substrate;
a gate electrode layer, disposed on the first insulating layer;
a second insulating layer, disposed on the gate electrode layer and the first insulating layer;
a source drain metal layer, disposed on the second insulating layer; and
a third insulating layer, disposed on the source drain metal layer and the second insulating layer,
wherein a source electrode via and a drain electrode via are disposed in the first insulating layer and the second insulating layer, a source electrode of the source drain metal layer is electrically connected to the polycrystalline silicon layer through the source electrode via, and a drain electrode of the source drain metal layer is electrically connected to the polycrystalline silicon layer through the drain electrode via;

wherein the electrode involves an anode and a cathode, and the anode, the organic light emitting material, and the cathode are sequentially disposed on the third insulating layer; and wherein an anode via is disposed in the third insulating layer, and the anode is electrically connected to the source drain metal layer through the anode via.

Still another aspect of the present application provides a photomask, including:

a plurality of pixel defining regions arranged in a matrix on a plane, configured to be used to form pixels areas of an organic light emitting diode (OLED) display panel, each of the pixel areas defined by an electrode and an organic light emitting material of the OLED display panel, wherein the pixel defining regions increase in size along a first direction and the pixel defining regions increase in size along a second direction perpendicular to the first direction.

In an embodiment of the present application, the pixel defining regions are hollowed-out regions.

Beneficial Effects

The OLED display panel of the present application includes the plurality of pixel areas, each of which is defined by the electrode and the organic light emitting material. The pixel areas increase in size along the first direction (i.e., the scan driving direction) and the pixel areas increase in size along the second direction (i.e., the data driving direction) perpendicular to the first direction. Accordingly, the present application avoids the feed-through effect caused in transmitting signals using the scan lines and the data lines, thereby achieving uniformity in displaying images.

DESCRIPTION OF DRAWINGS

FIG. 1 is a schematic diagram showing an existing OLED display panel.

FIG. 2 is a schematic diagram partially showing an OLED display panel according to the present application.

DESCRIPTION OF EMBODIMENTS OF DISCLOSURE

Figure 3:
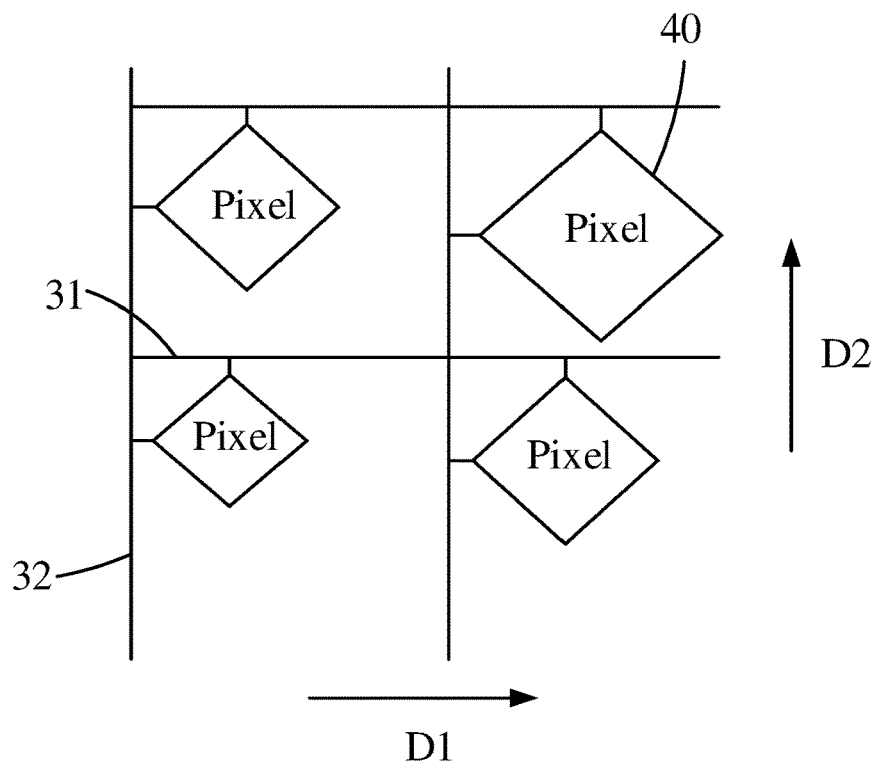
FIG. 3 is a schematic diagram showing an OLED display panel according to the present application.

To make the objectives, technical schemes, and effects of the present application more clear and specific, the present application is described in further detail below with reference to the embodiments in accompanying with the appending drawings. It should be understood that the specific embodiments described herein are merely for explaining the present application, the term "embodiment" used in the context means an example, instance, or illustration, and the present application is not limited thereto.

FIG. 2 is a schematic diagram partially showing an organic light emitting diode (OLED) display panel according to the present application. The OLED display panel includes a thin-film transistor (TFT) array substrate and organic electroluminescence (EL) devices 20 disposed on the TFT array substrate. The TFT array substrate includes a substrate 11, a polycrystalline silicon layer 12, a first insulating layer 13, a gate electrode layer 14, a second insulating layer 15, a source drain metal layer 16, and a third insulating layer 17. Each of the EL devices 20 includes an anode 21, an organic light emitting material 22, and a cathode 23.

The polycrystalline silicon layer 12 is disposed on the substrate 11. The first insulating layer 13 is disposed on the polycrystalline silicon layer 12 and the substrate 11. The gate electrode layer 14 is disposed on the first insulating layer 13. The second insulating layer 15 is disposed on the gate electrode layer 14 and the first insulating layer 13. The source drain metal layer 16 is disposed on the second insulating layer 15. The third insulating layer 17 is disposed on the source drain metal layer 16 and the second insulating layer 15. The anode 21, the organic light emitting material 22, and the cathode 23 of the EL device 20 are sequentially disposed on the third insulating layer 15.

The substrate 11 is a flexible substrate or a glass substrate. The polycrystalline silicon layer 12 has an undoped region located at a central portion, and doped regions located at two sides of the undoped region. The first insulating layer 13 is a separating layer, which can be a silicon nitride layer or a silicon dioxide layer. The first insulating layer 13 is deposited on the polycrystalline silicon layer 12 and the substrate 11 using chemical vapor deposition. The gate electrode layer 14 is made of a transparent conductive metal such as indium tin oxide (ITO). The second insulating layer 15 is a medium interlayer, which can be a silicon nitride layer or a silicon dioxide layer. The second insulating layer 15 is deposited on the gate electrode layer 14 and the first insulating layer 15 using chemical vapor deposition. The source drain metal layer 16 is made of a transparent conductive metal such as ITO. The source drain metal layer 16 has a source electrode 161 and a drain electrode 162 that are separated from each other. The third insulating layer is a flat layer, which can be a silicon nitride layer or a silicon dioxide layer. The third insulating layer is formed using chemical vapor deposition. The anode 21 of the EL device 20 is made of a transparent conductive metal such as ITO. The cathode 23 is made of silver. The organic light emitting material 22 is an organic light emitting material with self-luminescence function and is manufactured using vacuum evaporation.

A source electrode via 16a and a drain electrode via 16b are disposed in the first insulating layer 13 and the second insulating layer 15. The source electrode 161 of the source drain metal layer 16 is electrically connected to the polycrystalline silicon layer 12 through the source electrode via 16a. The drain electrode 162 of the source drain metal layer 16 is electrically connected to the polycrystalline silicon layer 12 through the drain electrode via 16b. An anode via 170 is disposed in the third insulating layer 17. The anode 21 of the EL device 20 is electrically connected to the drain electrode 162 of the source drain metal layer 16 through the anode via 170.

FIG. 3 is a schematic diagram showing an OLED display panel according to the present application. The OLED display panel includes a plurality of scan lines 31, a plurality of data lines 32, and a plurality of pixel areas 40 interlaced by the scan lines 31 and the data lines 32. The pixel areas 40 are arranged in a matrix on a plane. Referring to FIGS. 2 and 3, each of the pixel areas 40 is defined by the electrode 21 and/or 23 and the organic light emitting material 22 of the EL device 20. That is, the organic light emitting material 22 and the anode 21 (or the cathode 23) shown in FIG. 2 define the pixel area 40 shown in FIG. 3. Alternatively, it can be said that a light emitting area corresponding to one of the EL devices 20 defines the size of the pixel area 40.

As shown in FIG. 3, the pixel areas 40 increase in size along a first direction and the pixel areas 40 increase in size along a second direction perpendicular to the first direction. For example, as shown in FIG. 3, scan signals carried by the scan signals 31 are transmitted from left to right, that is, a scan driving direction is a left-to-right direction (horizontal direction) and is noted as D1; data signals carried by the data lines 32 are transmitted from bottom to top, that is, a data driving direction is a bottom-to-top direction (vertical direction) and is noted as D2. The pixel areas 40 increase in size along the scan driving direction and the pixel areas 40 increase in size along the data driving direction. Specifically, the pixel areas corresponding to a scan driving output end are larger than the pixel areas corresponding to a scan driving input end and the pixel areas corresponding to a data driving output end are larger than the pixel areas corresponding to a data driving input end.

The scan lines 31 and the data lines 32 are metal lines. The resistance of a metal line will increase as a propagated distance increases. Its voltage will decrease as well. This is called a feed-through effect. This effect becomes more apparent in large-scaled display panels. The feed-through effect on the scan lines 31 and the data lines 32 causes non-uniformity in displaying images. To overcome such a problem, the present application changes the size of the pixel areas 40 such that the pixel areas 40 increase in size along the scan driving direction and the pixel areas 40 increase in size along the data driving direction, as shown in FIG. 3. By this way, contact impedance of the pixel areas 40 is changed such that impedance is high for a small voltage drop and impedance is low for a large voltage drop, thereby affecting current intensity in light emission and ensuring uniformity of images displayed using the display panel.

The OLED display panel of the present application includes the plurality of pixel areas 40, each of which is defined by the electrode 21 and/or 23 and the organic light emitting material 22. The pixel areas 40 increase in size along the first direction (i.e., the scan driving direction) and the pixel areas 40 increase in size along the second direction (i.e., the data driving direction) perpendicular to the first direction. Accordingly, the present application avoids the feed-through effect caused in transmitting signals using the scan lines 31 and the data lines 32, thereby achieving uniformity in displaying images.

Figure 4:
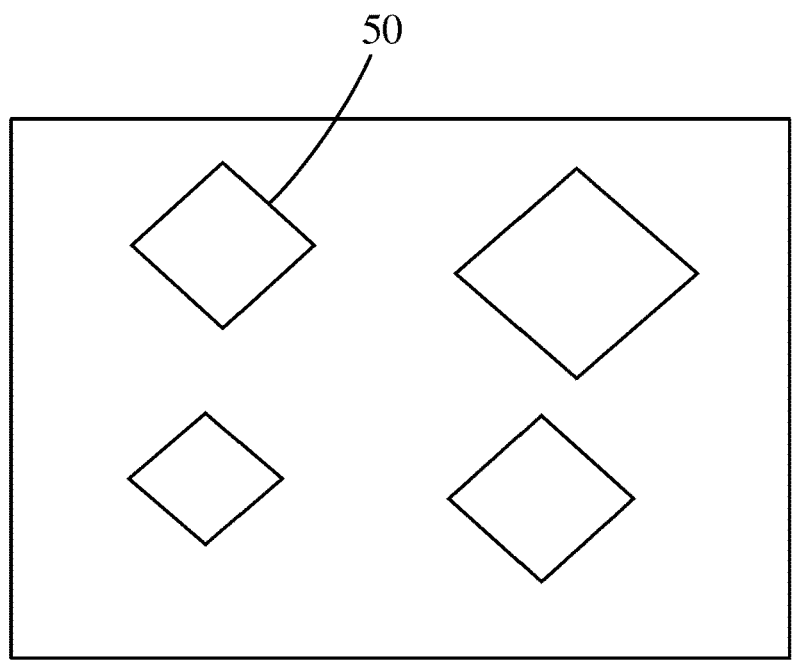
FIG. 4 is a schematic diagram showing a photomask according to the present application.

FIG. 4 is a schematic diagram showing a photomask according to the present application. The present application further provides a photomask, which includes a plurality of pixel defining regions 50 arranged in a matrix on a plane. The pixel defining regions 50 increase in size along a first direction and the pixel defining regions 50 increase in size along a second direction perpendicular to the first direction. As shown in FIGS. 2 to 4, the pixel defining regions 50 are configured to be used to form the pixels areas 40 of the OLED display panel. Each of the pixel areas 40 is defined by the electrode 21 and/or 23 and the organic light emitting material of the OLED display panel.

The pixel defining regions 50 are hollowed-out regions, which can cooperate with a positive photoresist or a negative photoresist to form the anode 21 and/or the cathode 23 of the EL device 20, and can also be used in vacuum evaporation to form the organic light emitting material 22.

Above all, while the preferred embodiments of the present application have been illustrated and described in detail, it is intended that the present application should not be limited to the preferred embodiment. Various modifications and alterations which maintain the realm of the present application can be made by persons skilled in this art. The protective scope of the present application is subject to the scope as defined in the claims.

The invention claimed is:

1. An organic light emitting diode (OLED) display panel, comprising:
   a plurality of pixel areas arranged in a matrix on a plane, each of the pixel areas defined by an electrode and an organic light emitting material, wherein the pixel areas increase in size along a scan driving direction and the pixel areas increase in size along a data driving direction, and wherein the pixel areas corresponding to a scan driving output end are larger than the pixel areas corresponding to a scan driving input end and the pixel areas corresponding to a data driving output end are larger than the pixel areas corresponding to a data driving input end.

2. The OLED display panel according to claim 1, wherein the electrode involves at least one of an anode and a cathode and the organic light emitting material is disposed between the anode and the cathode.

3. The OLED display panel according to claim 1, further comprising a thin-film transistor (TFT) array substrate, on which the electrode and the organic light emitting material are disposed, the TFT array substrate comprising:
   a substrate;
   a polycrystalline silicon layer, disposed on the substrate;
   a first insulating layer, disposed on the polycrystalline silicon layer and the substrate;
   a gate electrode layer, disposed on the first insulating layer;
   a second insulating layer, disposed on the gate electrode layer and the first insulating layer;
   a source drain metal layer, disposed on the second insulating layer; and
   a third insulating layer, disposed on the source drain metal layer and the second insulating layer,
   wherein a source electrode via and a drain electrode via are disposed in the first insulating layer and the second insulating layer, a source electrode of the source drain metal layer is electrically connected to the polycrystalline silicon layer through the source electrode via, and a drain electrode of the source drain metal layer is electrically connected to the polycrystalline silicon layer through the drain electrode via;
   wherein the electrode involves an anode and a cathode, and the anode, the organic light emitting material, and the cathode are sequentially disposed on the third insulating layer; and
   wherein an anode via is disposed in the third insulating layer, and the anode is electrically connected to the source drain metal layer through the anode via.

4. An organic light emitting diode (OLED) display panel, comprising:
   a plurality of pixel areas arranged in a matrix on a plane, each of the pixel areas defined by an electrode and an organic light emitting material, wherein the pixel areas increase in size along a first direction and the pixel areas increase in size along a second direction perpendicular to the first direction.

5. The OLED display panel according to claim 4, wherein the electrode involves at least one of an anode and a cathode and the organic light emitting material is disposed between the anode and the cathode.

6. The OLED display panel according to claim 4, wherein the first direction is a scan driving direction and the second direction is a data driving direction.

7. The OLED display panel according to claim 6, wherein the pixel areas corresponding to a scan driving output end are larger than the pixel areas corresponding to a scan driving input end and the pixel areas corresponding to a data driving output end are larger than the pixel areas corresponding to a data driving input end.

8. The OLED display panel according to claim 4, further comprising a thin-film transistor (TFT) array substrate, on which the electrode and the organic light emitting material are disposed, the TFT array substrate comprising:
a substrate;
a polycrystalline silicon layer, disposed on the substrate;
a first insulating layer, disposed on the polycrystalline silicon layer and the substrate;
a gate electrode layer, disposed on the first insulating layer;
a second insulating layer, disposed on the gate electrode layer and the first insulating layer;
a source drain metal layer, disposed on the second insulating layer; and
a third insulating layer, disposed on the source drain metal layer and the second insulating layer,
wherein a source electrode via and a drain electrode via are disposed in the first insulating layer and the second insulating layer, a source electrode of the source drain metal layer is electrically connected to the polycrystalline silicon layer through the source electrode via, and a drain electrode of the source drain metal layer is electrically connected to the polycrystalline silicon layer through the drain electrode via;
wherein the electrode involves an anode and a cathode, and the anode, the organic light emitting material, and the cathode are sequentially disposed on the third insulating layer; and
wherein an anode via is disposed in the third insulating layer, and the anode is electrically connected to the source drain metal layer through the anode via.

9. An photomask, comprising:
a plurality of pixel defining regions arranged in a matrix on a plane, configured to be used to form pixels areas of an organic light emitting diode (OLED) display panel, each of the pixel areas defined by an electrode and an organic light emitting material of the OLED display panel, wherein the pixel defining regions increase in size along a first direction and the pixel defining regions increase in size along a second direction perpendicular to the first direction.

10. The photomask according to claim 9, wherein the pixel defining regions are hollowed-out regions.

* * * * *

UNITED STATES PATENT AND TRADEMARK OFFICE
CERTIFICATE OF CORRECTION

| | |
|---|---|
| PATENT NO. | : 10,763,320 B2 |
| APPLICATION NO. | : 16/338721 |
| DATED | : September 1, 2020 |
| INVENTOR(S) | : Kaixiang Zhao |

It is certified that error appears in the above-identified patent and that said Letters Patent is hereby corrected as shown below:

On the Title Page

(30) Foreign Application Priority Data:
Change: (Absent information)
To "December 6, 2018 (CN) 201811489813.6"

Signed and Sealed this
Twenty-second Day of December, 2020

Andrei Iancu
*Director of the United States Patent and Trademark Office*